United States Patent [19]
Tesauro et al.

[11] Patent Number: 5,834,360
[45] Date of Patent: Nov. 10, 1998

[54] METHOD OF FORMING AN IMPROVED PLANAR ISOLATION STRUCTURE IN AN INTEGRATED CIRCUIT

[75] Inventors: Mark R. Tesauro, Dallas; Frank R. Bryant, Denton, both of Tex.

[73] Assignee: STMicroelectronics, Inc., Carrollton, Tex.

[21] Appl. No.: 690,738

[22] Filed: Jul. 31, 1996

[51] Int. Cl.$^6$ .................................................. H01L 21/76
[52] U.S. Cl. ...................... 438/445; 438/444; 438/446; 438/447
[58] Field of Search ........................... 437/69, 70, 72, 437/73; 438/444, 445, 446, 447

[56] References Cited

U.S. PATENT DOCUMENTS

| | | | |
|---|---|---|---|
| 4,026,740 | 5/1977 | Owen, III | 156/628 |
| 4,160,987 | 7/1979 | Dennard et al. | 357/41 |
| 4,266,985 | 5/1981 | Ito et al. | 148/1.5 |
| 4,407,696 | 10/1983 | Han et al. | 156/653 |
| 4,508,757 | 4/1985 | Fabricius et al. | 427/93 |
| 4,551,910 | 11/1985 | Patterson | 29/576 |
| 4,553,314 | 11/1985 | Chan et al. | 29/571 |
| 4,561,172 | 12/1985 | Slawinski et al. | 437/69 |
| 4,563,227 | 1/1986 | Sakai et al. | 438/445 |
| 4,637,128 | 1/1987 | Mizutani | 29/576 |
| 4,755,477 | 7/1988 | Chao | 437/36 |
| 4,842,675 | 6/1989 | Chapman et al. | 156/643 |
| 4,958,213 | 9/1990 | Eklund et al. | 357/59 |
| 5,130,268 | 7/1992 | Liou et al. | 437/67 |
| 5,151,381 | 9/1992 | Liu et al. | 437/69 |
| 5,192,707 | 3/1993 | Hodges et al. | 437/70 |
| 5,210,056 | 5/1993 | Pong et al. | 437/239 |

(List continued on next page.)

FOREIGN PATENT DOCUMENTS

| | | | |
|---|---|---|---|
| 58-40839 | 3/1983 | Japan | H01L 21/76 |
| 58-90778 | 5/1983 | Japan | H01L 29/78 |
| 59-65445 | 4/1984 | Japan | H01L 21/76 |
| 59-161837 | 9/1984 | Japan | H01L 21/76 |
| 63-289820 | 11/1988 | Japan | H01L 21/306 |
| 91-2335 | 11/1988 | Japan | H01L 21/76 |
| 63-300526 | 12/1988 | Japan | H01L 21/76 |
| 1-14926(A) | 1/1989 | Japan | H01L 21/318 |
| 1-205553 | 8/1989 | Japan | H01L 21/76 |
| 2-10836 | 1/1990 | Japan | H01L 21/316 |
| 0182956 | 7/1993 | Japan | . |

OTHER PUBLICATIONS

S. Marshall, et al., "Dry Pressure Local Oxidation of Silicon for IC Isolation", Journal of the Electrochemical Society, v. 122, No. 10, Oct. 1975.

R. Zeto, et al., "Low Temperature Thermal Oxidation of Silicon by Dry Oxygen Pressure above 1Atm", The Electrochemical Society, V. 122, No. 10, Oct. 1975.

Lin, et al., "Twin–White–Ribbon Effect and Pit Formation Mechanism in PBLOCOS", J. Electrochem. Soc., v. 138, No. 7, Jul. 1991, pp. 2145–2149.

(List continued on next page.)

Primary Examiner—Trung Dang
Attorney, Agent, or Firm—Theodore E. Galanthay; Lisa K. Jorgenson; Sanford E. Warren, Jr.

[57] ABSTRACT

A method is provided for forming an isolation structure at a semiconducting surface of a body, and the isolation structure formed thereby. A masking layer is formed over selected regions of the substrate surface; the masking layer preferably comprising a nitride layer overlying a pad oxide layer. The masking layer is patterned and etched to form openings exposing selected regions of the substrate surface. Recesses are formed into the substrate in the openings. Preferably a portion of the pad oxide layer is isotropically etched under the nitride layer forming an undercut region. An etch stop layer is formed over the substrate in the recesses filling in the undercut along the sidewalls. A second masking layer, preferably of nitride is formed over the etch stop layer and anisotropically etched to form nitride sidewalls in the openings. The etch stop layer may be etched away from the horizontal surfaces. The substrate in the openings is then oxidized to form a field oxide region substantially coplanar with the original substrate surface.

40 Claims, 5 Drawing Sheets

U.S. PATENT DOCUMENTS

| | | | |
|---|---|---|---|
| 5,258,333 | 11/1993 | Shappir et al. | 437/235 |
| 5,260,229 | 11/1993 | Hodges et al. | 437/69 |
| 5,264,724 | 11/1993 | Brown et al. | 257/347 |
| 5,286,672 | 2/1994 | Hodges et al. | 437/70 |
| 5,296,411 | 3/1994 | Gardner et al. | 437/238 |
| 5,310,692 | 5/1994 | Chan et al. | 437/41 |
| 5,318,922 | 6/1994 | Lim et al. | 437/69 |
| 5,393,692 | 2/1995 | Wu | 437/72 |
| 5,410,176 | 4/1995 | Liou et al. | 257/50 |
| 5,440,166 | 8/1995 | Dixit et al. | 257/508 |
| 5,457,067 | 10/1995 | Han | 437/72 |
| 5,470,783 | 11/1995 | Chiu et al. | 437/72 |
| 5,472,906 | 12/1995 | Shimizu et al. | 437/72 |
| 5,512,509 | 4/1996 | Han | 437/72 |
| 5,538,916 | 7/1996 | Kuroi et al. | 437/72 |
| 5,612,248 | 3/1997 | Jeng | 437/69 |

OTHER PUBLICATIONS

Irene, et al., "Residual Stress, Chemical Etch Rate, Refractive Index, and Density Measurements on SiO, Films Prepared Using High Pressure Oxygen", pp. 396–399, J. Electrochem. Soc., Feb. 1980.

VIB–1, "Integration of Poly Buffered Locos and Gate Processing for Submicrometer Isolation Technique", Juengling et al., IEEE Transactions on Electron Devices, V. 38, No. 12, Dec. 1991, p. 2721.

Kangar, et al., "An Integrated Isolation/Gate Process for Sub–Quarter Micron Technologies", pp. 141–142, May 1993 Symposium on VLSI Technology.

Josquin, et al., "The Oxidate Inhibition in Nitrogen–. . . Silicon", pp. 1803–1810, V. 129, No. 8, Aug. 1982, J. Electrochem. Soc.

Sung, et al., "Reverse L–Shape Sealed Poly–Buffer LOCOS Technology", IEEE Electron Device Letters, vol. 11, No. 11, Nov., 1990, pp. 549–551.

Eklund, et al., "A 0.5–$\mu$ BICOMS Technology for Logic and 4Mbid–class SRAM's", pp. 425–428, 1989 IEEE.

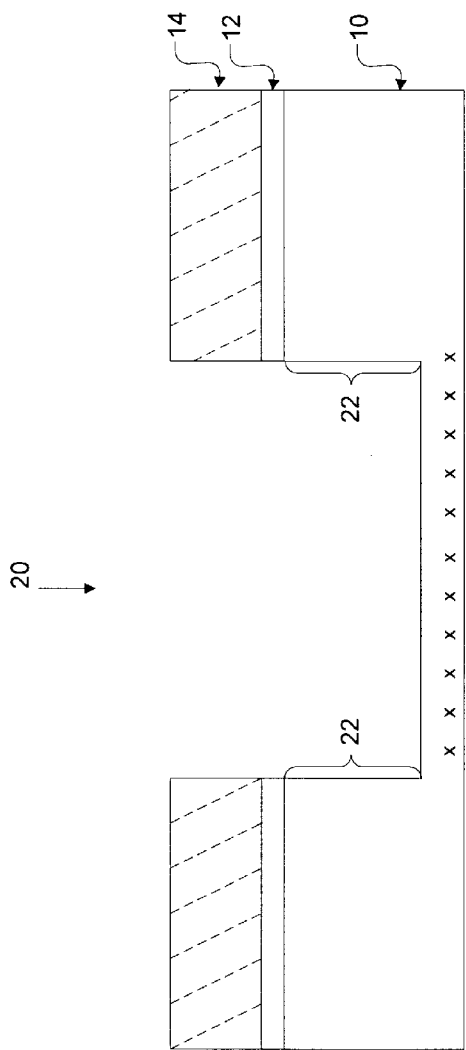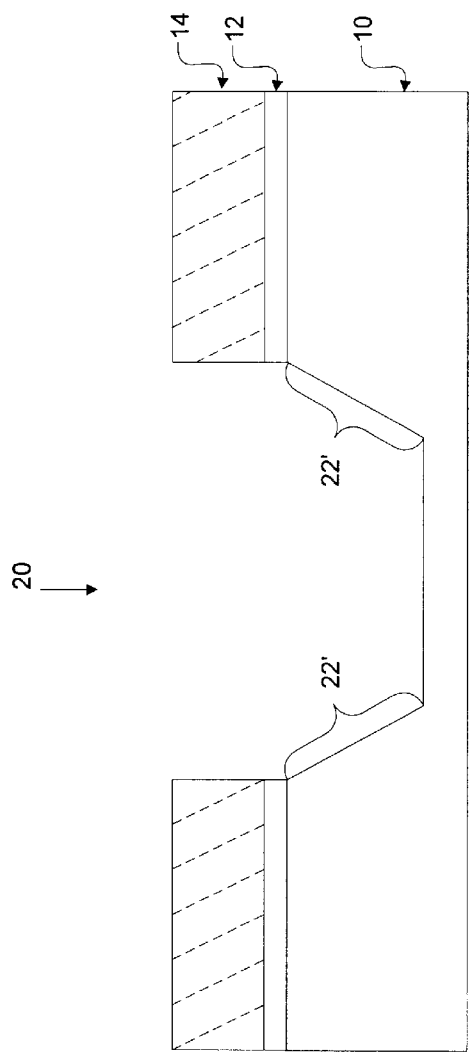

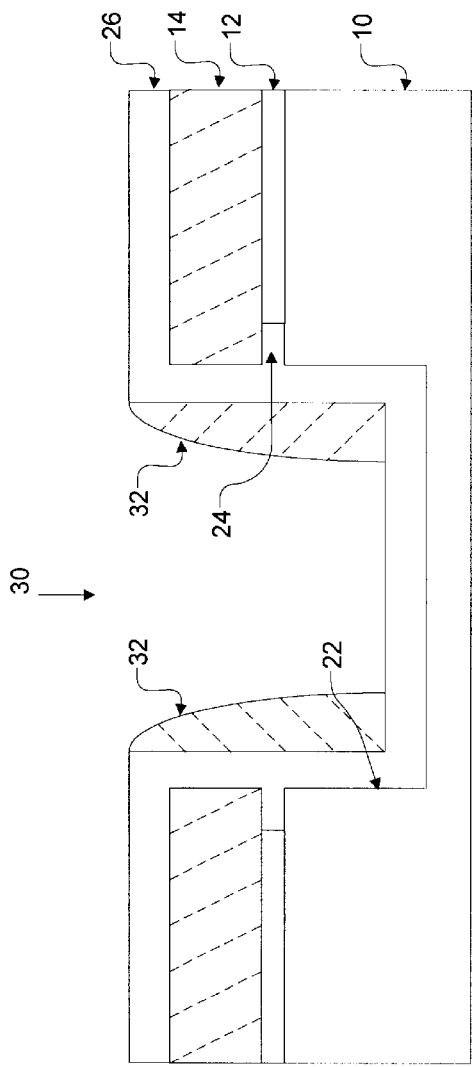
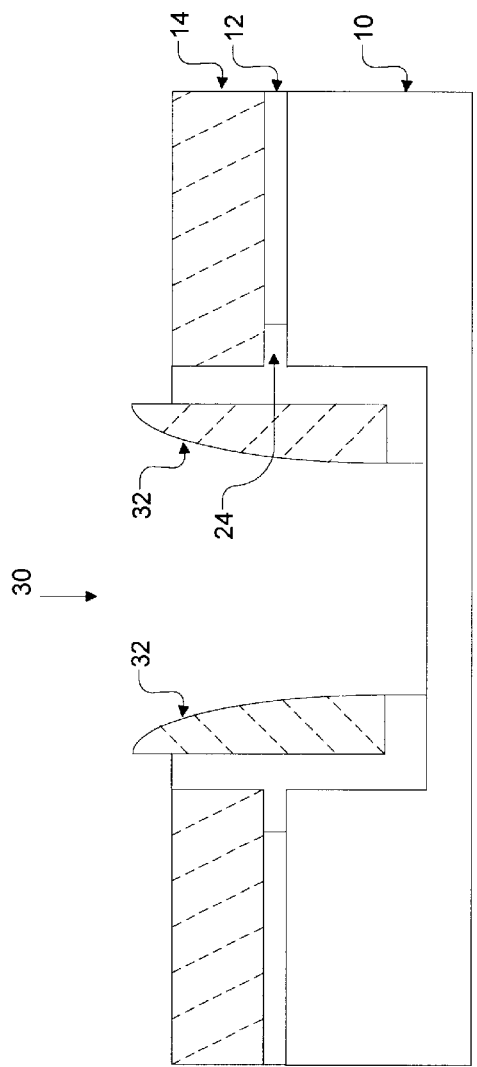

METHOD OF FORMING AN IMPROVED PLANAR ISOLATION STRUCTURE IN AN INTEGRATED CIRCUIT

FIELD OF THE INVENTION

The present invention relates generally to semiconductor integrated circuit processing, and more specifically to an improved method of forming planar isolation structures for isolation of active areas in an integrated circuit.

BACKGROUND OF THE INVENTION

As is well known in the field of integrated circuit design, layout and fabrication, the manufacturing cost of a given integrated circuit is largely dependent upon the chip area required to implement desired functions. The chip area, in turn, is defined by the geometries and sizes of the active components such as gate electrodes in metal-oxide-semiconductor (MOS) technology, and diffused regions such as MOS source and drain regions and bipolar emitters and base regions.

Device structures are constantly being proposed with the objective of producing higher response speeds, higher device yields and reliability, lower power consumption and higher power handling capability. Many of the device improvements are achieved by scaling down or miniaturizing the devices. One approach is to simply scale down all process variables, dimensions and voltages. This approach includes, among other factors, for example for the typical MOS device, scaling dielectric thicknesses, channel lengths and widths, junction widths and doping levels. With this approach, the number of devices per unit area increases, threshold voltages decrease, delay time across channels decreases and power dissipated per area decreases. All device parameters, however, do not need to be scaled by the same constant. A design or process engineer may scale some device parameters independently of others which would optimize device operation. This more flexible approach would allow for a choice in geometries to fit with various tradeoffs for device optimization, rather than choosing a more strict scaling approach.

In addition to the geometries and sizes of active components and the ability to scale process variables, the chip area also depends on the isolation technology used. Sufficient electrical isolation must be provided between active circuit elements so that leakage current and low field device threshold voltages do not cause functional or specification failures. Increasingly more stringent specifications, together with the demand, for example, for smaller memory cells in denser memory arrays, places significant pressure on the isolation technology in memory devices, as well as in other modern integrated circuits.

A well-known and widely-used isolation technique is the local oxidation of silicon to form a field oxide region between active areas, commonly referred to as LOCOS. The LOCOS process was a great technological improvement in reducing the area needed for the isolation regions and decreasing some parasitic capacitances. In LOCOS, an oxidation barrier (generally silicon nitride) is placed over the locations of the surface of the chip into which the active devices are to be formed (i.e., the active regions). The wafer is then placed in an oxidizing environment, generally in steam at a high temperature such as 1100° C. The portions of the wafer surface not covered by the oxidation barrier oxidize to form thermal silicon dioxide, with oxidation masked from the active regions by the oxidation barrier. LOCOS field oxide is generally formed to a sufficient thickness that a conductor placed thereover will not invert the channel thereunder, when biased to the maximum circuit voltage.

While LOCOS isolation is widely-used in the industry, it is subject to certain well-known limitations. A first significant limitation of LOCOS is the lateral encroachment known as "birdbeaking", of the oxide into the active areas, due to oxidation of silicon under the edges of the nitride mask. The expected distance of such encroachment must be considered in the layout of the integrated circuit; as such, the chip area is expanded as a result of the encroachment. Of course, the encroachment may be reduced by reducing the field oxide thickness, but at a cost of reduction of the threshold voltage of the parasitic field oxide transistor, and thus reduction of the isolation provided.

In addition, conventional LOCOS isolation adds topography to the integrated circuit surface. The additional topography results from the silicon dioxide necessarily occupying a greater volume than that of the silicon prior to its oxidation, due to the reaction of the oxygen therewith. As a result, the upper surface of conventional LOCOS field oxide lies above the surface of the active regions, with approximately half of the LOCOS field oxide thickness being above the active region surface. This topography requires overlying conductors to cover steps at the edges of the field oxide which, as is well known, presents the potential for problems in photolithography and in etching the conductor layer (i.e., the presence of filaments) and in the reliability of the conductor layer. In addition, the depth of field for submicron photolithography can be exceeded by the topography of the wafer surface.

An additional result with conventional LOCOS is the creation of undesired nitride spots forming along the interface of the silicon substrate and silicon oxide regions, known as the "Kooi" effect. Thermally grown gate oxides formed subsequent to the formation of the field oxide are impeded in the region of these nitride spots. Typically, these nitride spots are removed before gate oxides are formed, as with the well-known sacrificial oxide process as described more fully in U.S. Pat. No. 4,553,314 issued on Nov. 19, 1985 to Chan et al. However, this process of removing the nitride spots increases complexity and thus additional manufacturing costs as well as adding additional topography to the wafer causing step coverage problems at later stages.

A recent isolation technique uses trenches etched into the surface of the wafer at the isolation locations, which are subsequently filled with a thermal or deposited oxide. Such trench isolation can provide extremely thick isolation oxides which extend into the wafer surface with little or no encroachment, and which can have an upper surface which is relatively coplanar with adjacent active regions. An example of such trench isolation is described in U.S. Pat. No. 4,958,213, where a relatively deep trench is etched and subsequently filled with both deposited oxide and thermal oxide. It should be noted, however, that the etching of deep trenches is a relatively expensive process, and one which is quite difficult to perform while maintaining close geometries. In addition, it is well known that thermally formed silicon dioxide; the formation of thermal oxide in trenches, however, causes stress in the silicon, due to the volume expansion of silicon dioxide from that of the silicon prior to its oxidation. As a result, trench isolation tends to rely on deposited oxide to a large degree.

By way of further background, U.S. Pat. No. 4,842,675 describes a method of forming thermal LOCOS field oxide in combination with trenches. According to this method, recesses are etched into the surface of the wafer at the desired locations. A conformal layer of silicon nitride is deposited thereover, followed by deposition of a thicker layer of silicon oxide. The deposited silicon oxide is etched back to expose the silicon nitride at the bottom of the wider isolation locations, but not within the narrower isolation locations. The exposed nitride is etched away, the deposited silicon oxide is removed, and the exposed single crystal portions of the wafer are thermally oxidized in conventional LOCOS fashion. The remainder of the volume of the isolation locations are filled with deposited oxide, after the formation of the thermal oxide. It should be noted, however, that the availability of silicon for such oxidation is limited to that at the bottom surface of the wider recess. In addition, the process appears to be quite complex.

By way of further background, U.S. Pat. No. 5,130,268 describes a method of forming isolation structures into relatively shallow recesses etched into a surface of an integrated circuit. After the formation of the recesses, sidewall filaments of insulating material are formed into some or all of the recesses, exposing the bottom silicon portion of the recess. Selective epitaxy then forms a silicon layer within the recesses from the bottom up, but not along the sides. The selective epitaxial layer is oxidized so that the recesses are substantially filled with thermal silicon dioxide.

It is therefore an object of the present invention to provide a method of forming an isolation structure have a surface which is substantially coplanar with the surface of the adjacent active regions.

It is a further object of the present invention to provide such a method which utilizes thermal silicon dioxide as the isolation material.

It is a further object of the present invention to provide such a method which utilizes relatively shallow trenches in the surface of the wafer.

It is a further object of the present invention to provide such a method which substantially fills the isolation recesses with thermal silicon dioxide.

It is a further object of the present invention to provide such a method which can be used for both wide and narrow isolation locations.

It is a further object of the present invention to provide such a method which utilizes standard semiconductor processes.

Other objects and advantages of the present invention will be apparent to those of ordinary skill in the art having reference to the following specification together with the drawings.

SUMMARY OF THE INVENTION

The invention may be incorporated into a method for forming an isolation structure at a semiconducting surface of a body, and the isolation structure formed thereby. Recesses are formed into selected regions of the silicon substrate body. An etch stop layer, for example, polysilicon, is formed in the recesses over the exposed substrate. A masking layer, for example, nitride, is formed over the etch stop layer and etched back to form sidewall spacers along the sidewalls of the recesses. The substrate is then oxidized in the openings to form a field oxide or isolation structure which is substantially coplanar with the original surface of the substrate. Additionally, the field oxide has a reduced bird's beak extension into the active areas adjacent the recesses.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of illustrative embodiments when read in conjunction with the accompanying drawings, wherein:

FIGS. 1–8 are cross-sectional views of the fabrication of a semiconductor integrated circuit according to one embodiment of the present invention.

FIG. 6B is a cross-sectional view of the fabrication of a semiconductor integrated circuit according to an alternative embodiment of the present invention.

DETAILED DESCRIPTION OF THE PREFERRED EMBODIMENTS

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
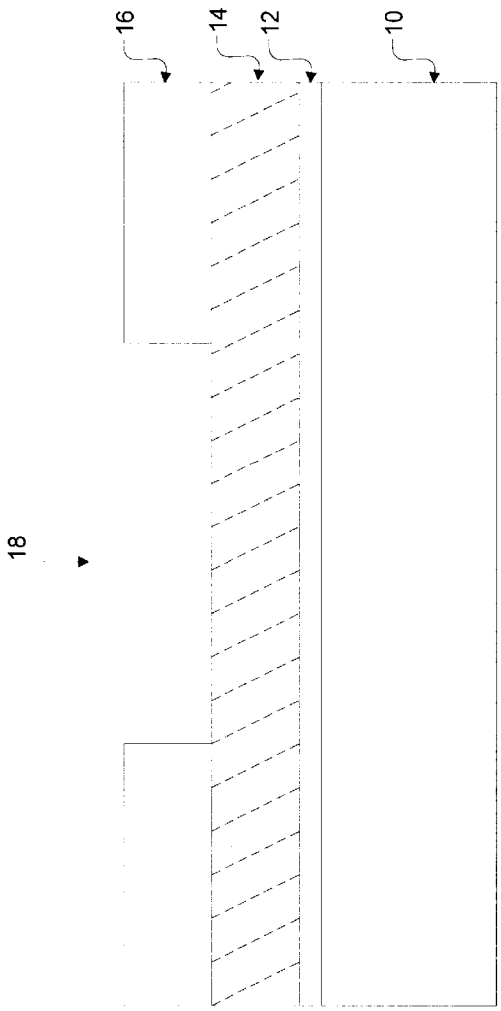

Referring now to FIGS. 1–8, a first embodiment of the present invention will now be described in detail. FIG. 1 illustrates a portion of a wafer, in cross-section, which has been partially fabricated. According to the example described herein, the present invention is directed to forming a CMOS planarized structure. It is contemplated, of course, that the present invention will also be applicable to the formation of other isolation structures where planarization is important.

FIG. 1 illustrates a portion of a wafer at which isolation structures and devices in adjacent active areas are to be formed. As shown in FIG. 1, an integrated circuit is to be formed on a body of substrate 10. The substrate may be made from any semiconductive material, for example, silicon, epitaxial silicon, germanium, gallium-arsenide, or the like. The substrate may be p- or n-doped silicon depending upon the location in the wafer where the isolation and active devices are to be formed. A first masking layer is formed over the silicon substrate. A stress relief pad oxide layer 12 is first deposited or grown on the substrate 10. The pad oxide layer 12 is typically formed by thermal oxidation at a temperature of approximately 700° to 1000° C. for several minutes to 2 hours which will grow the oxide to a thickness of between approximately 20 to 200 angstroms, more preferably 60 angstroms. A first nitride layer 14 comprising silicon nitride ($Si_3N_4$) is formed over the oxide layer 12. Layer 14 will typically have a thickness of between approximately 50 to 2000 angstroms, more preferably 800 angstroms. Layer 14 may be formed by chemical vapor deposition as is known in the art or by rapid thermal nitridation (RTN) of the oxide layer 12, although RTN may be difficult to control for submicron geometries. RTN of the oxide layer will result in a smaller pad oxide layer 12 under the first silicon nitride layer 14. A photoresist layer 16 is formed over the first nitride layer 14, patterned and etched to form an opening 18 to define an area in which the isolation or field oxide region is to be formed.

Figure 2:
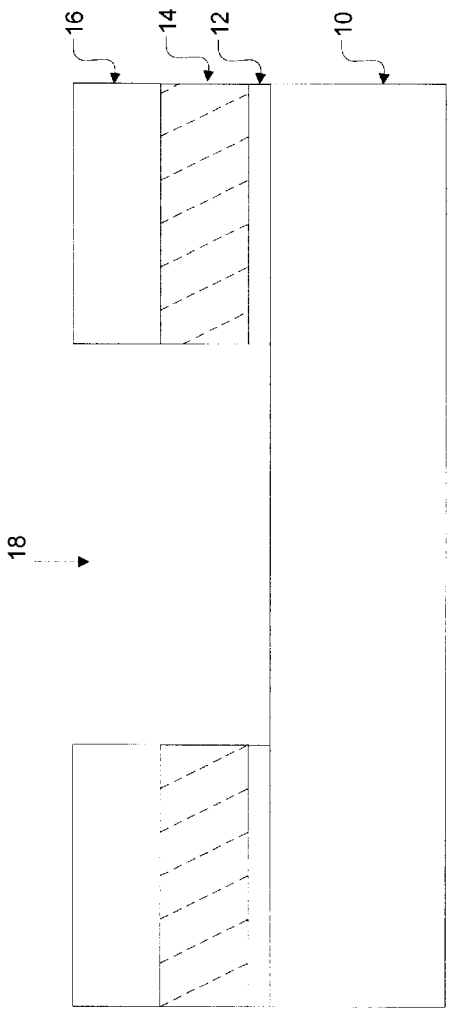

Referring to FIG. 2, the pad oxide layer 12 and first nitride layer 14 are etched in the opening 18, preferably by an anisotropic etch to expose the underlying substrate where the isolation region will ultimately be formed. The isolation structure may be within a single doped region, such as an n- or p-well or may be at boundaries between doped regions of opposite conductivity type, such as between n- or p-wells. The substrate areas which remain covered by the pad oxide 12 and nitride 14 will have active devices formed therein separated by the isolation structure or field oxide regions to be formed in opening 18.

Referring to FIG. 3A, the substrate 10 is etched, preferably by an anisotropic etch to a depth of between approximately 200 to 2000 angstroms, more preferably to a depth of approximately 1000 angstroms. This etch step forms a trench or recess in opening 20 having sidewalls 22.

Referring to FIG. 3B, while an anisotropic etch will generally form vertical sidewalls 22, these sidewalls may be angled in either direction from the vertical such as through a combination isotropic and anisotropic etch or a substantially anisotropic etch and still achieve the desired results. For example, a substantially anisotropic etch or combination isotropic/anisotropic etch may result in sidewalls having as much as a 20 degree or more slope from the vertical, shown as sidewalls 22'.

Referring again to FIG. 3A, this etch will allow subsequent formation of the isolation structure or field oxide in opening 20 to form a substantially coplanar upper surface with the original substrate surface underlying the pad oxide 12 and first nitride layer 14. At this stage, a channel stop implant may be made into the silicon substrate 10 in opening 20. If an implant is done, as represented by the X's, these ions will have sufficient energy to penetrate the silicon substrate 10 in opening 20 but will not have sufficient energy to penetrate the first nitride layer 14 and pad oxide layer 12. The dopants will thus be implanted only in opening 20, preferably comprising $BF_2$ implanted at a dosage of approximately $4 \times 10^{13}$ atoms/cm$^3$ at an energy level of approximately 50 KeV. The following process steps will flow from FIG. 3A. One skilled in the art will appreciate that these same following process steps may flow from FIG. 3B to achieve similar desired results.

Figure 4:
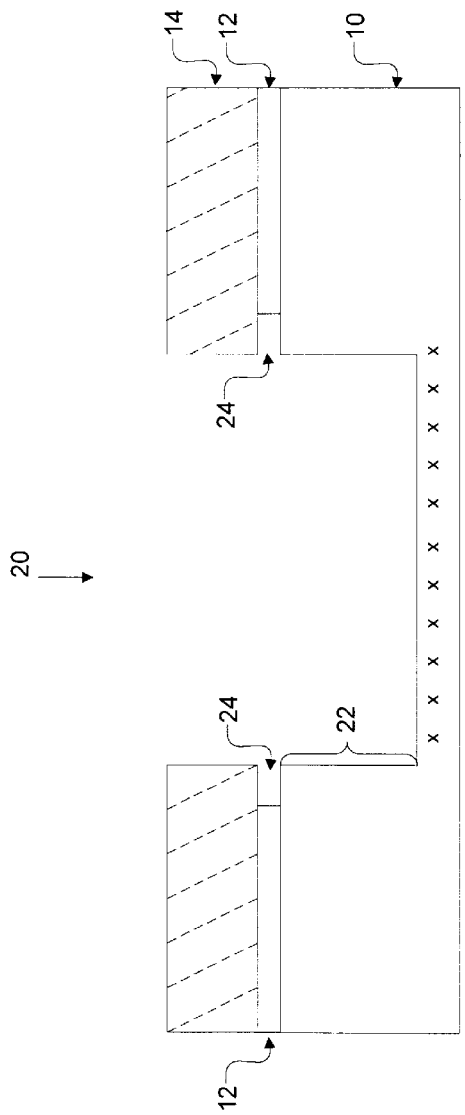

Referring to FIG. 4, at this stage if desired, the pad oxide layer adjacent the sidewalls 22 of the recess in opening 20 may be partially etched, preferably by an isotropic etch which selectively removes the pad oxide. The preferred etch ratio is a 10:1 $H_2O$/HF solution for approximately 120 seconds which selectively etches the pad oxide over the silicon and under the nitride. The pad oxide etch will form an undercut region 24 where the pad oxide is removed under the first nitride layer 14. Some of the advantages for this undercut are to reduce the formation of a bird's beak during the subsequent formation of the isolation structure and to reduce the conductive channel for oxidants during the thermal oxidation of the substrate. For purposes of subsequent process steps described below, it will be assumed that the undercut is desired and created. It will, of course, be understood by one skilled in the art that such undercut is not necessary to achieve a coplanar isolation structure.

Figure 5:
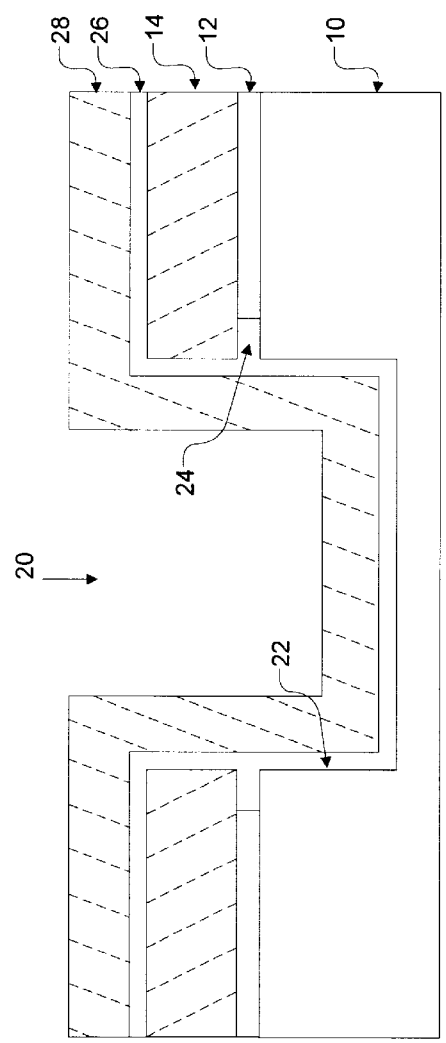

Referring to FIG. 5, an etch stop layer 26 is formed over the first nitride layer 14 and in the opening 20 over the recess and along the sidewalls 22 of the recess. Etch stop layer 26 is preferably polycrystalline or amorphous silicon deposited to a thickness of between 10 to 500 angstroms, more preferably 300 angstroms. Polysilicon will have several advantages if used as the etch stop layer and for end point detection. Polysilicon deposition can fill the undercut region 24 under the first nitride layer 14 thereby further reducing the conductive channel for oxidants during the subsequent oxidation of the silicon in the recess to form the isolation structure. Thus, the deposited silicon will help reduce any resulting bird's beak formation. A second masking layer is formed over the etch stop layer 26. The masking layer is formed preferably of a second nitride layer 28 comprising silicon nitride ($Si_3N_4$) which is formed over the etch stop layer 26. Layer 28 will typically have a thickness of between approximately 50 to 1000 angstroms, more preferably 850 angstroms. Nitride layer 28 will typically be formed by chemical vapor deposition, similar to layer 14.

Referring to FIG. 6A, the second masking layer 28 is etched back, preferably by an anisotropic etch to form sidewall spacers 32 as is known in the art. Etching masking layer 28 will stop when the etch stop layer 26 is reached. Sidewall spacers will thus form along the sidewalls of etch stop layer 26 in opening 30. If the nitride masking layer is overetched, some of the etch stop layer will probably be etched also along the horizontal surfaces.

Referring to FIG. 6B, an alternative embodiment is shown in which the etch stop layer 26 is etched from the horizontal surfaces overlying nitride layer 14 and the silicon substrate in the recess in opening 30. The advantage of etching the etch stop layer from the horizontal surfaces is to eliminate a removal step, if necessary, after the subsequent thermal oxidation step.

Figure 7:
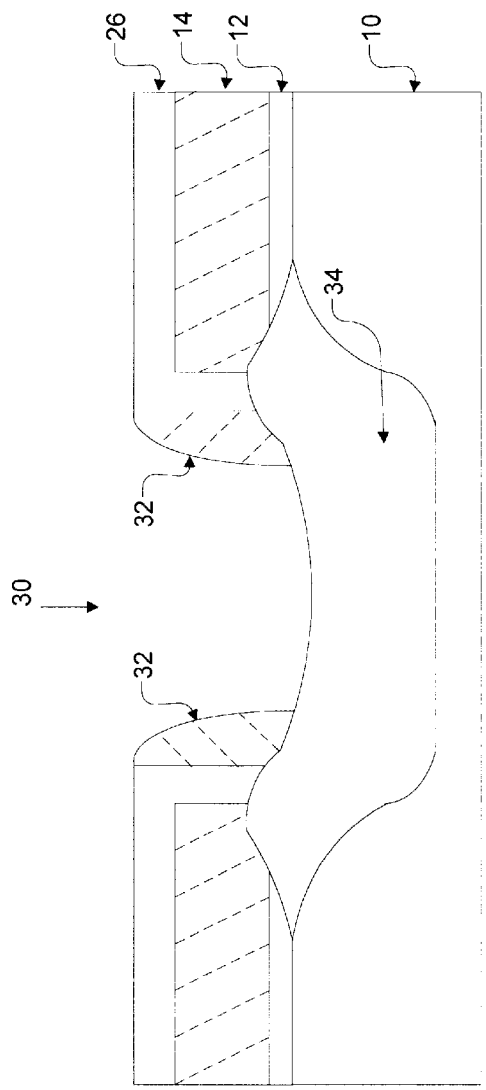

Referring to FIG. 7, an isolation structure or field oxide region 34 is thermally grown in opening 30. Field oxide 34 is grown by methods known in the art such as wet oxidation at temperatures of around 1000° C. for ½ to 2 hours. The overall thickness of the resulting field oxide, which will include a portion of the silicon substrate 10 and the etch stop layer 26, if not previously removed from the horizontal surface above the silicon substrate 10, will be between approximately 500 to 5000 angstroms, more preferably 4000 angstroms. The polysilicon etch stop layer 26 and a portion of the nitride layers 14 and 32 may be oxidized during the thermal oxidation step including the polysilicon along the sidewalls of the recess adjacent the active areas. Thus, the final thickness of the field oxide 34 will depend upon the starting depth of the etched substrate in opening 30 and the desired final thickness of the grown field oxide. For example, the final thickness will depend on the thickness of any remaining polysilicon etch stop layer which may be oxidized during the thermal oxidation step and converted to oxide. In addition, some amount of the field oxide may be etched away during subsequent steps such as growing and removing a strip gate oxide. In other words, the final field oxide will have a thickness such that an upper surface of the field oxide will be approximately at or substantially planar with an upper surface of the original substrate surface. For example, if the substrate is etched wherein the substrate surface in the opening is approximately 1000 angstroms below the original substrate surface, then the thickness of the grown field oxide may be approximately 4500 angstroms in order that the upper surface of the final field oxide is approximately at or substantially planar with the upper surface of the original substrate surface. Since the field oxide was grown from an etched substrate at a lower starting location than the original substrate surface, the isolation distance between the active areas and devices is increased due to the additional length of the sidewall of the trench formed into the substrate.

In the prior art, the field oxide grows where there is no masking nitride such as that found at the edges of the exposed substrate where active devices are to be formed. Some oxidation will occur in a lateral direction causing the field oxide to grow under the pad oxide and lift the nitride edges, thus forming a bird's beak.

However, in the present invention in which the substrate has been etched below its original surface before the thermal oxidation step, the growth of the field oxide begins below the nitride sidewall spacers 32 and tends to grow more vertically than laterally relative to the original pattern. In this case, the nitride sidewall spacers will minimize the lateral oxidation of the vertical sidewalls of the silicon substrate to help reduce the bird's beak at the edge of the field oxide. The field oxide will, however, laterally extend to some distance under the nitride layer 14, particularly if the pad oxide is not undercut as described above and shown in FIG. 4. The etch stop layer formed in the undercut and if formed of polysilicon may help to reduce the lateral encroachment of the field oxide growth under the nitride mask. The nitride sidewalls 32 as well as the nitride layer 14 and etch stop layer 26 will lift up along the upper surface of the field oxide as the field oxide is grown but should not peel away.

Figure 8:
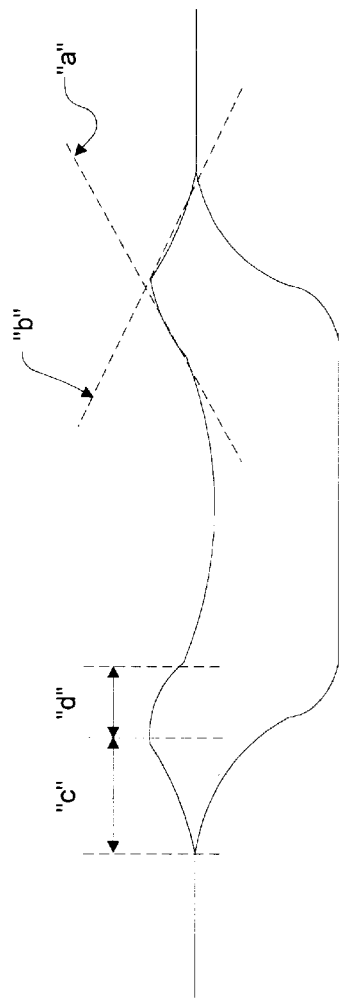

Referring to FIG. 8, most of the polysilicon etch stop layer and some of the nitride masking layers will generally be converted to oxide during the thermal oxidation step. After the formation of the isolation structure or field oxide layer 34, the first and second masking layers 14, 32 and the etch stop layer 26 are removed. The shape of the resulting bird's beak of the field oxide region will generally form in the region of the field oxide and not into the active area and will depend upon such parameters as the length of the field oxide or distance between active devices and overall depth of the field oxide as well as various process parameters, for example, the thicknesses of the first and second masking layers and the etch stop layer. As an example, given the process parameters described above, the bird's beak of the resulting field oxide may leave behind a distinct footprint and may have a receding edge slope, or the slope of the line "a" toward the center of the field oxide of between approximately 20 to 30 degrees. The bird's beak may have a leading edge slope, or slope of the line "b" toward the center of the active area of between approximately 5 to 15 degrees. The length of the final encroachment "c" of the bird's beak, which is the distance from the original masking nitride layer 14 to the end of the final bird's beak into the active area may by between approximately 0 to 100 nanometers, more preferably 75 nanometers. The receding edge length "d" of the bird's beak into the center of the isolation structure will be shorter for shallower isolation structures and longer for deeper isolation structures. For example, the length of the receding edge may be between approximately 40 to 120 nanometers, more preferably, 80 nanometers.

In the present invention, the bird's beak is reduced since the lateral growth of the field oxide is reduced. Minimization of the lateral growth is important to reduce the lateral stress which causes crystal defects in the substrate and to maximize active device regions. Additionally, the field oxide can be grown to the desired thickness while at the same time achieving more planarity with the upper surface of the substrate and adjacent devices. The height of the upper surface of the field oxide above the upper surface of the substrate will vary depending upon the desired final thickness of the field oxide but will cause fewer step coverage problems for subsequent processing steps. At this stage, subsequent process steps known in the art to form such devices and layers as sacrificial gate oxides and polysilicon gates and interconnects and the like may now begin, starting with a more planar surface.

While the invention has been described herein relative to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A method of forming an isolation structure at a semiconducting surface of a body; comprising:

forming a first masking layer, comprising a silicon nitride layer directly overlying a pad oxide layer, over selected locations of the semiconducting surface corresponding to active regions, the first masking layer comprising an oxidation barrier material;

etching a recess into the surface at a location not covered by the masking layer;

etching the pad oxide layer adjacent the recess, wherein the etched pad oxide layer forms an undercut region under the silicon nitride layer that reduces the formation of a bird's beak and reduces the conductive channel for oxidants during the oxidation step;

forming an etch stop layer over the surface and recess;

forming a second masking layer over the etch stop layer, the second masking layer comprising an oxidation barrier material;

etching the second masking layer to form sidewall spacers along the sides of the etch stop layer along the sidewalls of the recess adjacent the active regions; and oxidizing the surface to form an isolation structure between active regions.

2. The method of claim 1, further comprising:

implanting a channel stop in the recess, wherein the implant comprises $BF_2$ implanted at a dosage of approximately $4 \times 10^{13}$ atoms/cm$^3$ at an energy level of approximately 50 KeV.

3. The method of claim 1, wherein the nitride layer is formed to a thickness of between approximately 50 to 2000 angstroms.

4. The method of claim 3, wherein the nitride layer is preferably formed to a thickness of approximately 800 angstroms.

5. The method of claim 1, wherein the pad oxide layer is formed to a thickness of between approximately 200 to 200 angstroms.

6. The method of claim 5, wherein the pad oxide layer is preferably formed to a thickness of approximately 60 angstroms.

7. The method of claim 1, wherein the etching the pad oxide layer step comprises substantially an anisotropic etch.

8. The method of claim 1, wherein the etching the pad oxide layer step comprises substantially an isotropic etch.

9. The method of claim 1, wherein the second masking layer comprises silicon nitride.

10. The method of claim 1, wherein the second masking layer is formed to a thickness of between approximately 50 to 1000 angstroms.

11. The method of claim 1, wherein the second masking layer is preferably formed to a thickness of approximately 850 angstroms.

12. The method of claim 1, wherein the etch stop layer comprises polysilicon.

13. The method of claim 1, wherein the etch stop layer is formed to a thickness of between approximately 10 to 500 angstroms.

14. The method of claim 13, wherein the etch stop layer is preferably formed to a thickness of approximately 300 angstroms.

15. The method of claim 1, wherein the recess is formed to a depth of between approximately 200 to 2000 angstroms.

16. The method of claim 15, wherein the recess is preferably formed to a depth of approximately 1000 angstroms.

17. The method of claim 1, wherein the recess is formed by a substantially anisotropic etch.

18. The method of claim 1, wherein the oxidation step forms an isolation region substantially coplanar with the surface.

19. The method of claim 1, wherein the isolation region is formed to a thickness of between approximately 500 to 5000 angstroms.

20. The method of claim 19, wherein the isolation region is preferably formed to a thickness of approximately 4000 angstroms.

21. The method of claim 1, further comprising:
oxidizing the etch stop layer in the recess adjacent the active regions during the oxidation step.

22. The method of claim 21, wherein the oxidation of the etch stop layer reduces the bird's beak encroachment into the active area and reduces the substrate recess sidewall oxidation.

23. The method of claim 1, further comprising:
preferentially removing the etch stop layer from horizontal surfaces after the sidewall spacers are formed and before the oxidation step.

24. The method of claim 1, further comprising:
removing the sidewall spacers, etch stop layer and first masking layer after the oxidation step.

25. The method of claim 1, wherein the isolation structure has a bird's beak having a leading edge slope of between approximately 5 to 15 degrees.

26. The method of claim 1, wherein the isolation structure has a bird's beak having a receding edge slope of between approximately 20 to 30 degrees.

27. The method of claim 26, wherein the length of the receding edge of the isolation structure bird's beak is shorter for shallower isolation structures and longer for deeper isolation structures.

28. The method of claim 27, wherein the length of the receding edge of the isolation structure bird's beak is between approximately 40 to 120 nanometers.

29. The method of claim 28, wherein the length of the receding edge of the isolation structure bird's beak is more preferably 80 nanometers.

30. The method of claim 1, wherein the isolation structure has a final encroachment of between approximately 0 to 100 nanometers on each end adjacent the active regions.

31. The method of claim 30, wherein the isolation structure has a preferable final encroachment of approximately 75 nanometers on each end adjacent the active regions.

32. A method of forming an isolation structure at a semiconducting surface of a body; comprising:
forming a pad oxide layer over selected locations of the surface;
forming a first nitride layer over the pad oxide layer;
patterning and etching the pad oxide and nitride layers corresponding to active regions and forming an opening therethrough exposing a portion of the surface;
forming a recess into the surface corresponding to the location of the opening;
etching the pad oxide layer to form and undercut under the first nitride layer;
forming a polysilicon etch stop layer over the pad oxide and nitride layers and in the opening;
forming a second nitride layer over the polysilicon layer;
etching the second nitride layer to form nitride sidewall spacers in the opening; and
oxidizing the surface in the opening to form an isolation structure between the active regions.

33. The method of claim 32, wherein the etching the pad oxide layer comprises substantially an anisotropic etch.

34. The method of claim 32, wherein the etching the pad oxide layer comprises substantially an isotropic etch.

35. The method of claim 32, wherein the undercut reduces the formation of a bird's beak and reduces the conductive channel for oxidants during the oxidation step.

36. The method of claim 32, wherein the oxidation step forms the isolation structure substantially coplanar with the surface.

37. The method of claim 32, wherein the etching the second nitride layer comprises substantially an anisotropic etch.

38. The method of claim 32, further comprising:
oxidizing the polysilicon etch stop layer in the recess adjacent the active regions during the oxidation step.

39. The method of claim 38, wherein the oxidation of the polysilicon etch stop layer reduces the bird's beak encroachment into the active area and reduces the substrate recess sidewall oxidation.

40. The method of claim 32, further comprising:
preferentially removing the polysilicon etch stop layer from horizontal surfaces after the sidewall spacers are formed and before the oxidation step.

* * * * *